United States Patent
Taniguchi et al.

(10) Patent No.: US 6,208,224 B1
(45) Date of Patent: Mar. 27, 2001

(54) SURFACE ACOUSTIC WAVE FILTER WITH PARALLEL ARM RESONATORS HAVING DIFFERENT RESONANT FREQUENCIES

(75) Inventors: Norio Taniguchi; Tadamasa Ushiroku, both of Ishikawa-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/317,814

(22) Filed: May 24, 1999

(30) Foreign Application Priority Data

May 26, 1998 (JP) ................................................ 10-144653

(51) Int. Cl.[7] ...................................................... H03H 9/64
(52) U.S. Cl. ............................................. 333/193; 333/195
(58) Field of Search .................................. 333/193–196; 310/313 R, 313 B, 313 C, 313 D

(56) References Cited

U.S. PATENT DOCUMENTS

| | | | |
|---|---|---|---|
| 5,471,178 | * 11/1995 | Hickernell | 333/193 |
| 5,638,036 | * 6/1997 | Penunuri et al. | 333/194 |
| 5,726,610 | * 3/1998 | Allen et al. | 333/193 X |
| 5,844,453 | * 12/1998 | Matsui et al. | 333/193 |
| 5,999,069 | * 12/1999 | Ushiroku | 333/193 |
| 6,025,762 | * 2/2000 | Roy et al. | 333/150 |
| 6,031,435 | * 2/2000 | Inose et al. | 333/193 |

FOREIGN PATENT DOCUMENTS

| | | |
|---|---|---|
| 2208341 | 3/1989 | (GB) . |
| 2286304 | 8/1995 | (GB) . |
| 56-19765 | 5/1981 | (JP) . |
| 10-242799 | * 9/1998 | (JP) . |

OTHER PUBLICATIONS

The Institute of Electronics, Information and Communication Engineers Technical Report, Japan US95–25, EMD95–21, 33 (Jul. 1995), p39–p46, "A Ladder Filter Using One–Port Saw Resonators"; Y. Satoh et al.

* cited by examiner

Primary Examiner—Robert Pascal
Assistant Examiner—Barbara Summons
(74) Attorney, Agent, or Firm—Keating & Bennett, LLP

(57) ABSTRACT

A surface acoustic wave filter having a ladder type circuit configuration, includes series resonators provided as part of a series arm disposed between input and output terminals and parallel resonators included in a plurality of parallel arms, respectively, defined between the series arm and a reference potential. The series resonators and parallel resonators each include a one-port surface acoustic wave resonator, the parallel resonators are arranged alternately with the series resonators along a direction from the input terminal toward the output terminal, and the resonant frequency of at least one parallel resonator is different from the resonant frequencies of the other parallel resonators.

14 Claims, 9 Drawing Sheets

SURFACE ACOUSTIC WAVE FILTER WITH PARALLEL ARM RESONATORS HAVING DIFFERENT RESONANT FREQUENCIES

BACKGROUND OF THE INVENTION

1. Field of the Invention

The present invention relates to a surface acoustic wave filter including a plurality of one-port surface acoustic wave resonators (one-port SAW resonators) and, more particularly, to a surface acoustic wave filter having a ladder-type circuit configuration including a plurality of one-port SAW resonators connected to each other in a ladder-type configuration.

2. Description of the Related Art

A conventional band filter includes a surface acoustic wave filter having a ladder type circuit configuration of a plurality of one-port SAW resonators connected to each other in a ladder type configuration (for example, Japanese Examined Patent Publication No. 56-19765).

The circuit of a surface acoustic wave filter of this type is partially shown in FIG. 10, a series arm is provided between an input terminal 51 and an output terminal (not shown), and a series resonator S1 is included in the series arm. A parallel resonator P1 is connected between the series arm and a reference potential, and thereby, a parallel arm is formed. Although only one series resonator S1 and one parallel resonator P1 are shown in FIG. 10, a plurality of series arms containing a plurality of series resonators and a plurality of parallel arms containing parallel resonators are arranged to extend in the direction from the input terminal 51 toward the output terminal.

Ordinarily, the one-port SAW resonators each defining the above-mentioned series resonator S1 and the parallel resonator P1 have an electrode structure shown in FIG. 11. As seen in FIG. 11, the one-port SAW resonator has a structure in which one pair of interdigital electrodes 52a and 52b are provided on a piezoelectric substrate (not shown) whereby one interdigital transducer (IDT) 52 is produced. Grating type reflectors 53 and 54 are arranged on the opposite sides of the IDT 52 in the surface acoustic wave propagation direction.

FIG. 12 illustrates the typical filter characteristics of a surface acoustic wave device having a ladder type circuit configuration containing the above-described one-port SAW resonators defining the series resonator and the parallel resonator.

For a band filter, it is necessary to increase the attenuation in the frequency range outside of the filter pass-band. Accordingly, for the purpose of increasing the attenuation in the frequency range outside of the filter pass band, a mirror image type connection structure shown in FIG. 13 is generally used.

A mirror image type connection structure is a structure in which a connection structure including one series resonator and one parallel resonator is connected to a connection structure including one series resonator and one parallel resonator such that both connection structures define a mirror image of each other relative to the boundary between the connection structures. More particularly, the series and parallel resonators of the connection structure shown by a broken line A in FIG. 13 are connected to portions of the connection structure surrounded by a broken line B adjacent to the broken line A such that both connection structures have a mirror image relationship relative to a boundary therebetween. Similarly, the connection structure surrounded by a broken line C is arranged to have a mirror image relationship with the connection structure surrounded by the broken line B relative to a boundary therebetween.

More specifically, on the opposite sides of the boundary, the parallel resonators P1 and P2 are arranged in the boundary area of the connection structures surrounded by the broken lines A and B, and the series resonators S1 and S2 are arranged so as to be spaced far from the joining area of both of the connection structures, respectively.

For a surface acoustic wave filter of the above described type, it is required that its reflection characteristic (VSWR) is low in the filter pass band. It is known that in order to reduce the reflection characteristic to a value of about 2.0, which is generally required, the difference between the resonant frequency of the series resonators S1, S2, and S3 and that of the parallel resonators P1, P2, and P3 is adjusted. See, for example, THE INSTITUTE OF ELECTRONICS, INFORMATION AND COMMUNICATION ENGINEERS TECHNICAL REPORT, JAPAN US95-25, EMD95-21, 33 (1995-07), p39–p46.

More particularly, it is known that in the surface acoustic wave filter having a ladder type circuit configuration shown in FIG. 13, VSWR can be reduced by changing the difference between the resonant frequency of the series resonators S1, S2, and S3 and that of the parallel resonators P1, P2, and P3.

In the above-described prior art, it is described that VSWR is reduced in a filter pass band by changing the difference between the resonant frequency of the series resonators S1, S2, and S3 and that of the parallel resonators P1, P2, and P3. In this prior art, it is described that VSWR is varied as shown in FIG. 14 when the above resonant frequency difference is changed.

More particularly, in the case that the difference between the resonant frequency of the series resonator and that of the parallel resonator is small, VSWR is large on the lower frequency side, as shown by an arrow C in FIG. 14. On the contrary, in the case that the above frequency difference is small, VSWR is large on the higher frequency side as shown by an arrow D in FIG. 14.

Thus, there is a problem with the prior art described above in that if VSWR on the lower frequency band side is reduced, VSWR is increased and degraded on the higher frequency band side.

SUMMARY OF THE INVENTION

To overcome the problems described above, preferred embodiments of the present invention provide a surface acoustic wave filter having a ladder type circuit configuration containing a plurality of series resonators and parallel resonators in which VSWR can be reduced in a wide frequency range in filter pass band, and thereby, the insertion loss is significantly reduced.

The surface acoustic wave filter having a ladder type circuit configuration includes series resonators provided in a series arm located between input and output terminals and parallel resonators included in plural parallel arms, respectively, located between the series arm and a reference potential. The series resonators and the parallel resonators each include a one-port surface acoustic wave resonator, the parallel resonators are arranged alternately with the series resonators in a direction extending from the input terminal toward the output terminal, and the resonant frequency of at least one of the parallel resonators is different from the resonant frequencies of the other parallel resonators. Thus, the different resonant levels in the band can be adjusted, depending on the way the resonant frequencies of the parallel resonators are differentiated, and thereby, VSWR in the band can be significantly reduced, and the insertion loss is greatly improved in a wide frequency range in the band.

The electrode finger pitches of the interdigital transducers of the plurality of parallel resonators are preferably different from each other so that the resonant frequency of the at least one parallel resonator is different from the resonant frequencies of the other parallel resonators. Accordingly, when the series resonators and the parallel resonators are arranged to define a ladder type circuit on one piezoelectric substrate, the surface acoustic wave filter with the VSWR characteristic improved in the pass band can be easily provided by changing the electrode pattern of an IDT of one of the parallel resonators.

In a preferred embodiment of the present invention, first, second, and third parallel arms are arranged along the direction extending from the input terminal toward the output terminal in that order, and the resonant frequency of the parallel resonator included in the second parallel arm is different from the resonant frequencies of the parallel resonators included in the first and third parallel arms, respectively. In the surface acoustic wave filter having the ladder type circuit configuration containing a relatively small number of the parallel resonators, the reduction of VSWR in the pass band, particularly on the lower frequency side, can be achieved, and the surface acoustic wave filter having excellent insertion characteristics in the pass band can be provided.

The resonant frequency of the parallel resonator included in the second parallel arm is preferably lower than the resonant frequency of each parallel resonator included in the first and third parallel arms, and more preferably, the resonant frequency f1 of the parallel resonator included in the second parallel arm and the resonant frequency f2 of at least one of the parallel resonators included in the first and third parallel arms preferably are arranged so as to satisfy the formula (1): f2>f1>0.99×f2. In this case, the VSWR characteristic in the band, particularly on the lower frequency side, can be improved. In this case, the electrode finger pitch L1 of the parallel resonator included in the second parallel arm and the electrode finger pitch L2 of the parallel resonators included in the first and/or third parallel arm are preferably arranged to satisfy the formula (2): L2<L1<1.01×L2.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
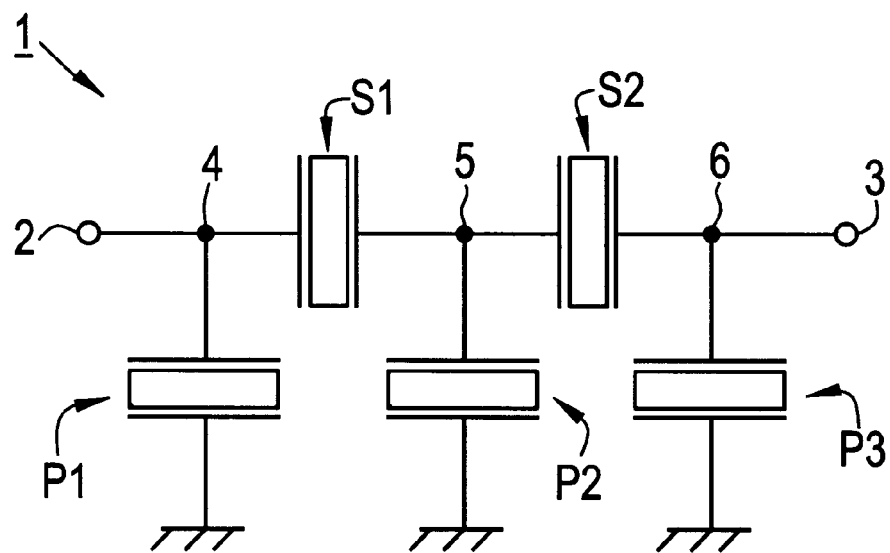
FIG. 1 is a circuit diagram of a surface acoustic wave filter according to a first preferred embodiment of the present invention.

FIG. 1 is a circuit diagram showing a circuit configuration of a surface acoustic wave filter according to a first preferred embodiment of the present invention. In a surface acoustic wave filter 1, series resonators S1 and S2 are connected between an input terminal 2 and an output terminal 3 so as to define a series arm. Between the series arm and a reference potential, a plurality of parallel arms are provided. That is, a first parallel resonator P1 is connected between a node 4, which lies between the input terminal 2 and the series resonator S1, and a reference potential, so as to define a first parallel arm. Further, a second parallel resonator P2 is connected between a node 5, located between the series resonators S1 and S2, and the reference potential, so as to define a second parallel arm. Moreover, a third parallel resonator P3 is connected between a node 6, located lies between the series resonator S2 and the output terminal 3, and the reference potential, so as to define a third parallel arm.

One of the novel features of the surface acoustic wave filter 1 of this preferred embodiment is that the resonant frequency of the second parallel resonator P2 is different from the resonant frequencies of the first and third parallel resonators P1 and P3, and thereby, VSWR is reduced in a wide frequency range in a pass band of the filter. This will be described below.

In the prior art described above, it is described that the position of the frequency where VSWR is increased is varied by changing the difference between the resonant frequency of the series resonators and that of the parallel resonators. Probably, this is caused by different resonances occurring due to the impedance relationships between the series and the parallel resonators. The resonance levels are varied with the above-described frequency differences.

Figure 13:
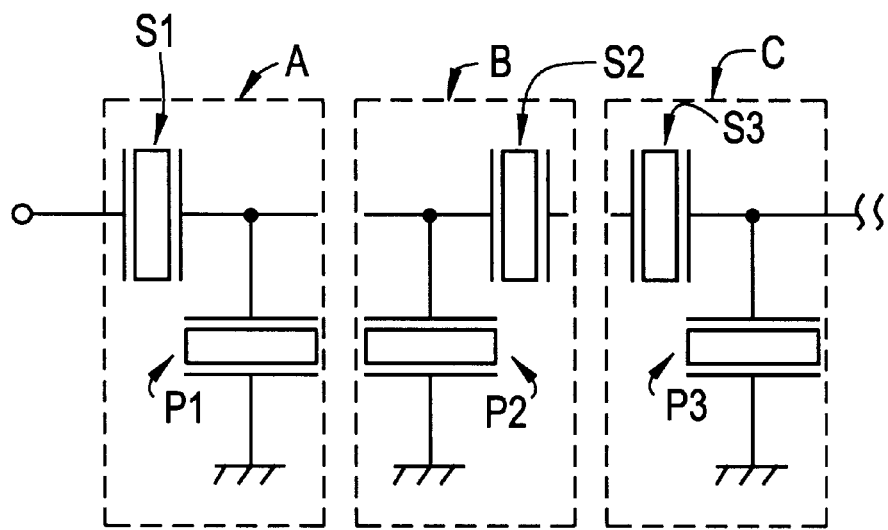
FIG. 13 is a circuit diagram which explains the circuit configuration of the conventional surface acoustic wave filter.
Figure 14:
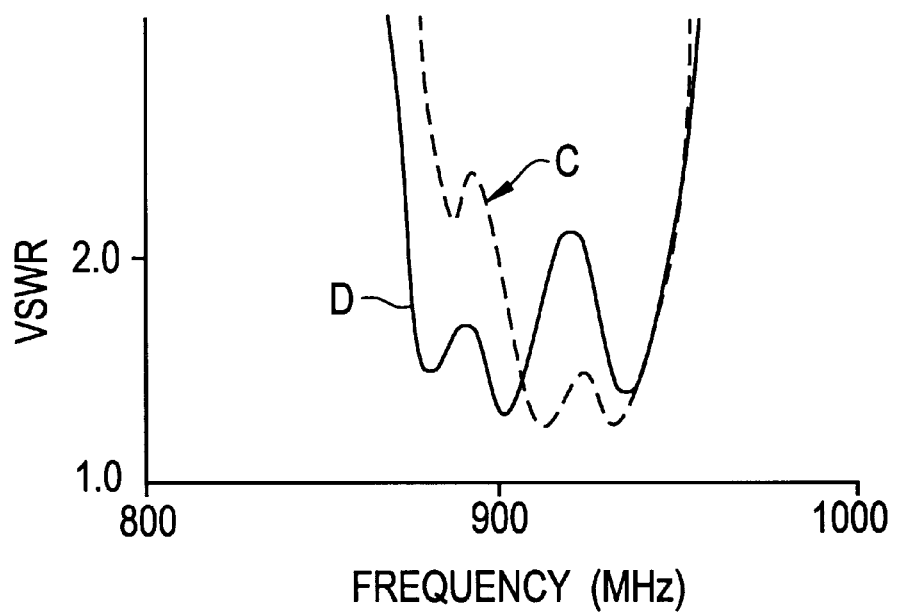
FIG. 14 is a graph which explains the VSWR characteristics of the conventional surface acoustic wave filter.

However, as shown in FIG. 13, with the conventional surface acoustic wave filter including a plurality of connection structures each containing one series resonator and one parallel resonator and connected to each other in a mirror image relationship, it is difficult to combine all of these different types of resonance without problems. That is, for the surface acoustic wave filter shown in FIG. 13, the resonant frequencies of all of the series resonators S1 through S3, and moreover, the resonant frequencies of all of the parallel resonators P1 through P3 are set to be the same, since the filter has the mirror image connection-arrangement. Thus, it was very difficult to optimize all of the above-described resonance phenomena only by adjusting the frequency difference between the series resonators S1 through S3 and the parallel resonators P1 through P3.

On the contrary, in the present preferred embodiment, by making the resonant frequencies of the plurality of parallel resonators P1 through P3 different, the above-described different levels of resonance within the band are greatly improved, and thereby, VSWR can be greatly reduced in a wide frequency range in the band.

In the surface acoustic wave filter 1 including the first, second, and third parallel resonators P1 through P3 arranged along the direction from the input terminal toward the output terminal in order of the first, the second and the third parallel resonators, as in the present preferred embodiment, if the resonant frequency f1 of the second parallel resonator P2 disposed at the middle position and the resonant frequency f2 of the first and third parallel resonators P1 and P3 satisfy f2>f1, preferably, f2>f1>0.99×f2, VSWR on the lower frequency side in the band is greatly reduced, and thereby, the insertion loss is significantly improved. The reasons for such advantageous results will be described below.

Regarding the surface acoustic wave filter having the same connection structure as shown in FIG. 1, that is, a connection structure obtained by arranging the series resonators S1 and S2 and the parallel resonators P1–P3 on a piezoelectric substrate, according to the following specifications, its VSWR was determined.

Series resonators S1 and S2
  Length of an aperture: 40 μm
  Number of pairs of electrode fingers: 100 pairs
  Number of electrode fingers of reflector: 100
Parallel resonators P1 and P3
  Length of an aperture: 40 μm
  Number of pairs of electrode fingers: 90 pairs
  Number of electrode fingers of reflector: 100
Parallel resonators P2
  Length of an aperture: 40 μm
  Number of pairs of electrode fingers: 180 pairs
  Number of electrode fingers of reflector: 100

It is noted that VSWR is an index which represents the reflection quantity of the surface acoustic wave filter 1 on the input or the output side. As VSWR in a pass band becomes smaller, the characteristic improves. Particularly, when the filter is used as the band filter of a portable telephone, it is desirable that VSWR has a value of up to about 2 in the pass band.

Figure 2:
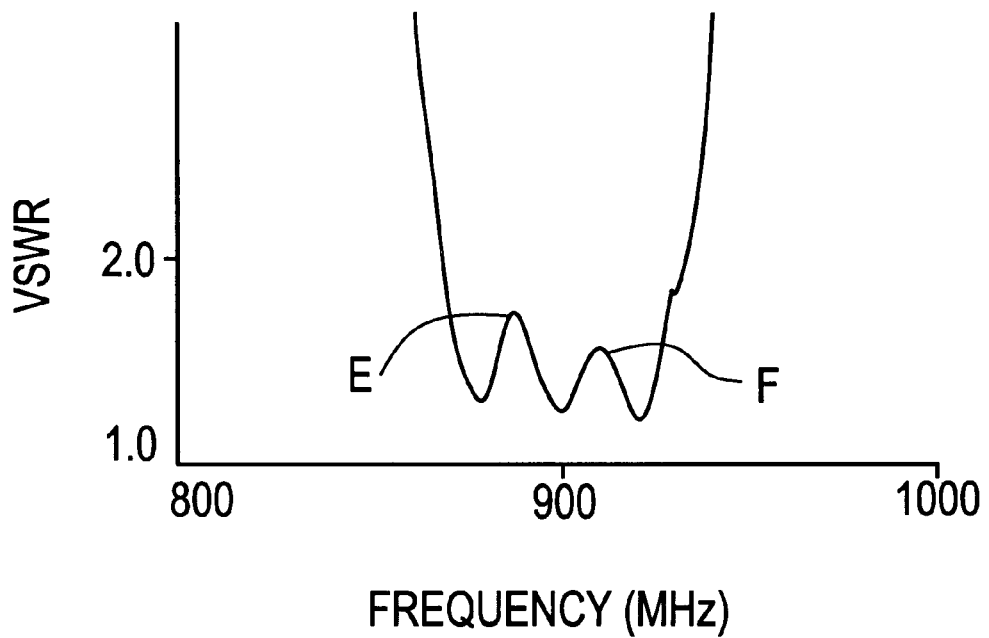
FIG. 2 is a graph showing the VSWR characteristic of a conventional surface acoustic wave filter.

In FIG. 2, it is seen that the maximum points E and F of VSWR exist in the band on the higher and lower frequency sides. This is a generally observed phenomenon, as understood in the description of the relationship of the difference between the resonant frequency of the series resonators and that of the parallel resonators to VSWR. This occurs due to the plural resonant phenomena in the band.

Then, by comparison, it was investigated how the maximum point E on the lower frequency side and the maximum point F on the higher frequency side are different in this preferred embodiment and the conventional example.

First, in the conventional example, the parallel resonators P1 through P3 were changed at the same time while making sure that the resonant frequencies of the parallel resonators P1 through P3 were the same. The change of VSWR, caused in this case, is shown in FIG. 3.

Figure 3:
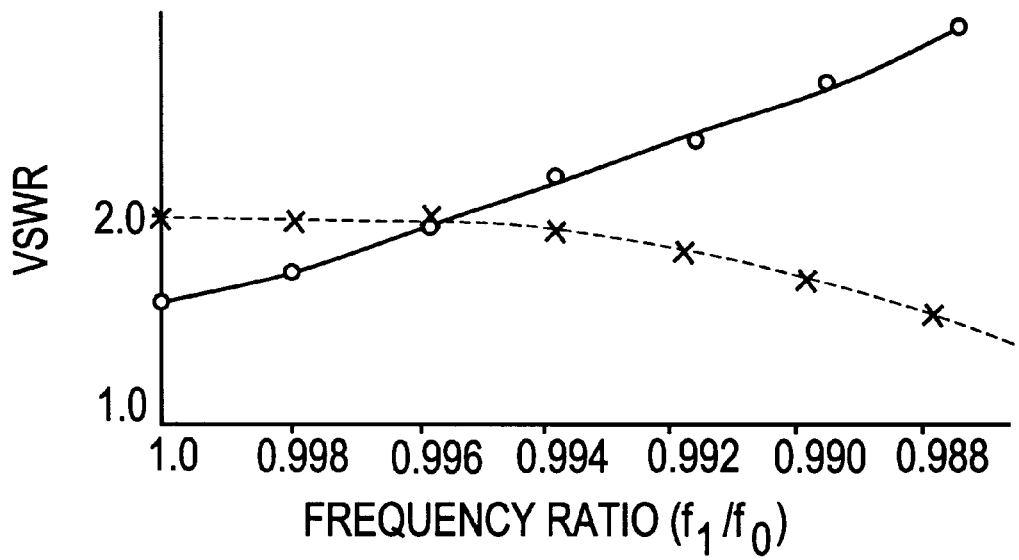
FIG. 3 is a graph showing the relationship between the frequency ratio of the parallel resonators of the conventional surface acoustic wave filter and VSWR.

In FIG. 3, the frequency ratio of the parallel resonators is plotted on the abscissa, and VSWR is plotted on the ordinate. The frequency ratio is defined as $f_1/f_0$ in which $f_0$ represents the resonant frequency of the reference parallel resonator obtained by a conventional design technique and supposed to be optimum, and $f_1$ represents the resonant frequency of the parallel resonators.

Further, in FIG. 3, the solid line represents the VSWR characteristic on the higher frequency side which corresponds to the above-described maximum point F on the higher frequency side, and the broken line represents the VSWR characteristic on the lower frequency side which corresponds to the maximum point E on the lower frequency side.

As seen in FIG. 3, with the frequency ratio decreased, that is, with the resonant frequency of the parallel resonators decreased, the maximum point of VSWR on the lower frequency side becomes smaller, namely, the characteristic is improved. However, with respect to the maximum point F of VSWR on the higher frequency side, as the resonant frequency is decreased, the characteristic is degraded to a greater degree.

That is, it is seen that at a frequency ratio where VSWR on the lower frequency side is improved only by about 0.1–0.2, VSWR on the higher frequency side exceeds the tolerance, namely, exceeds the value of approximately 2.

Figure 4:
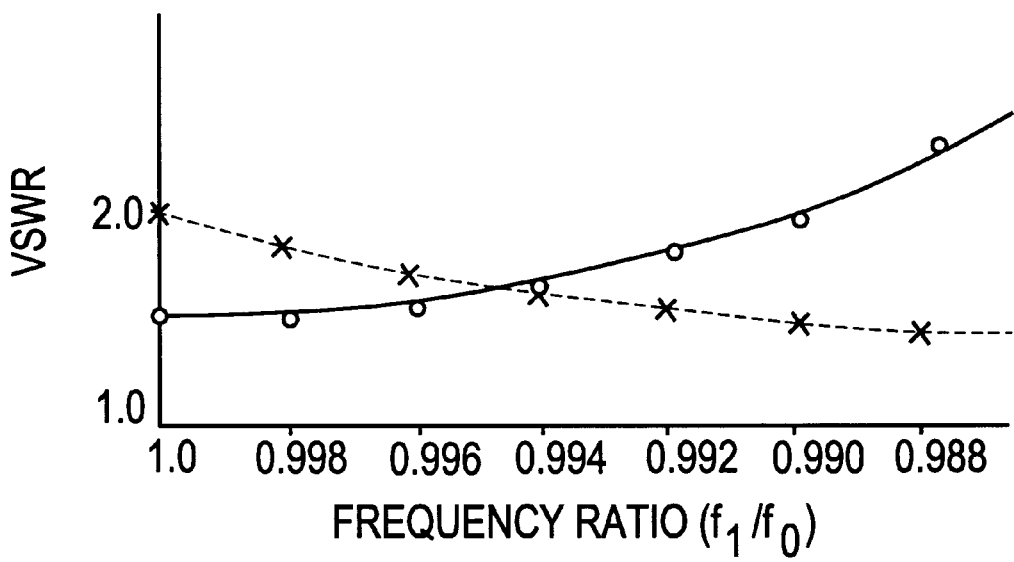
FIG. 4 is a graph showing the relationship between the frequency ratio of the parallel resonators of the surface acoustic wave filter of the first preferred embodiment and VSWR.

FIG. 4 illustrates the results obtained when the frequency of the second parallel resonator P2 only of the surface acoustic wave filter 1 of the above preferred embodiment was decreased. The frequency ratio of the parallel resonators is plotted on the abscissa. In this case, the frequency ratio is defined as (the resonant frequency of the second parallel resonator P2)/(the resonant frequency of the first and third parallel resonator P1 and P3), where the resonant frequencies of the first and third parallel resonators P1 and P3 are fixed and have a value similar to the above-described standard frequency of the conventional example as shown in FIG. 3.

As seen in FIG. 4, as the resonant frequency of the second parallel resonator is reduced, the maximum point of VSWR on the lower frequency side becomes sufficiently small (see the broken line). On the other hand, as the resonant frequency of the second parallel resonator P2 is reduced, the VSWR characteristic on the higher frequency side is decreased, as shown by the solid line. However, the change of the VSWR characteristic on the higher frequency side is very small as compared with the conventional example shown in FIG. 3.

It is seen that when the ratio of the resonant frequency of the second parallel resonator P2 relative to that of the first and third parallel resonators P1 and P3 is varied up to the value of about 0.990, VSWR on the higher frequency side is increased to a value of about 2.0, and the maximum point of VSWR on the lower frequency side is improved by about 0.5.

Accordingly, it is seen that by setting the resonant frequency of the second parallel resonator in the range defined by the above formula (1), the VSWR characteristic on the higher frequency side is reduced to a value of up to about 2, the VSWR characteristic on the lower frequency side is significantly improved, and thereby, the insertion loss is greatly reduced in a wide frequency range.

Hereinafter, a more concrete example of the surface acoustic wave filter 1 of the first preferred embodiment will be described.

Figure 5:
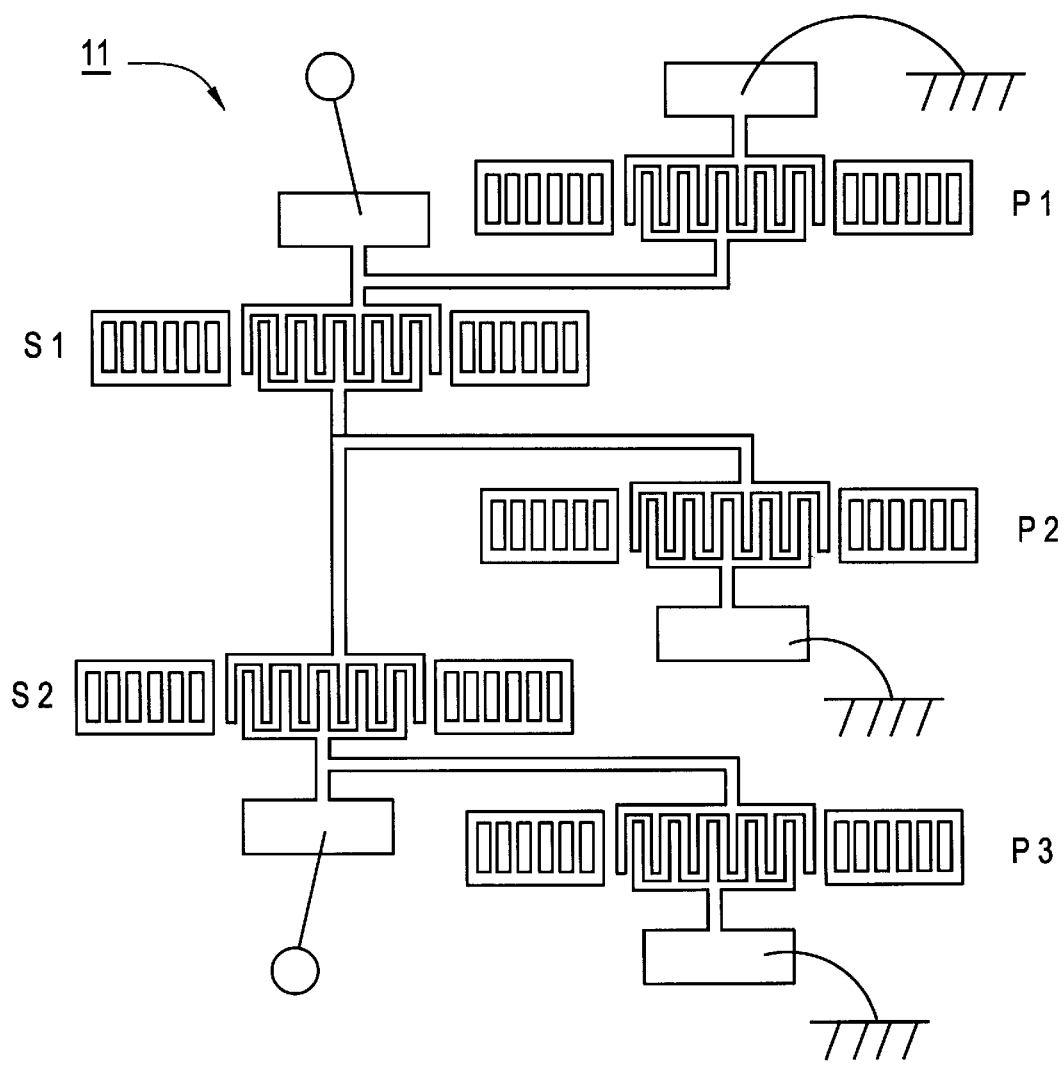
FIG. 5 is a plan view of the surface acoustic wave filter according to the first preferred embodiment of the present invention.

As seen in the plan view of FIG. 5, as the surface acoustic wave filter 1, the series resonators S1 and S2 and the parallel resonators P1–P3 each including a one-port SAW resonator were provided on a LiTaO$_3$ substrate 11. The electrode finger pitches of IDT of the parallel resonators P1–P3 were set as listed in Table 1 set forth below. That is, the electrode finger pitch of the second parallel resonator P2 was set at about 2.110 μm, which is higher than the electrode finger pitch of about 2.100 μm of the first and third parallel resonators P1 and P3.

In this case, the resonant frequencies of the parallel resonators P1–P3 are listed below in Table 1.

More particularly, the resonant frequency of the second parallel resonator P2 is about 1938 MHz, which is lower than the resonant frequency of about 1948 MHz of the first and third parallel resonators P1 and P3. The above-described frequency ratio of the parallel resonators is about 0.9952.

For comparison, as a conventional example, a surface acoustic wave filter was produced in the same manner as the above-described preferred embodiment except that all of the electrode pitches of IDT of the parallel resonators P1–P3 were set at about 2.100 μm.

TABLE 1

| Resonator | Electrode finger pitch of first preferred embodiment (μm) | Electrode finger pitch of conventional example (μm) | Frequency of first preferred embodiment (MHz) | Frequency of conventional example (MHz) |
| --- | --- | --- | --- | --- |
| P1 | 2.100 | 2.100 | 1948 | 1948 |
| P2 | 2.110 | 2.100 | 1938 | 1948 |
| P3 | 2.100 | 2.100 | 1948 | 1948 |

Figure 6A:
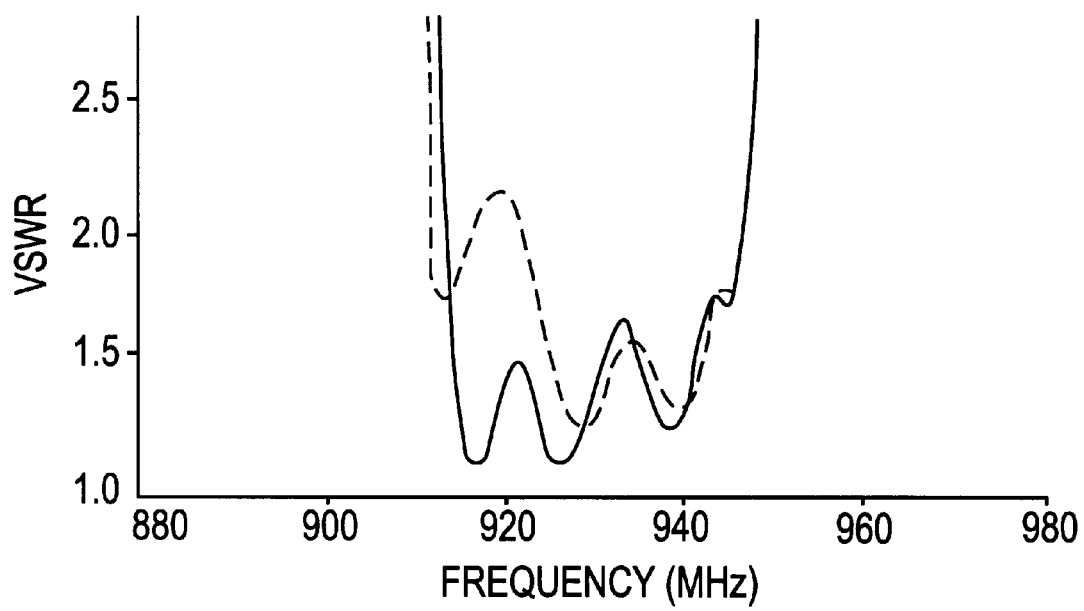
FIGS. 6A and 6B are graphs showing the VSWR characteristics and the insertion loss-frequency characteristics of the surface acoustic wave filters of the first preferred embodiment and the conventional example.
Figure 6B:
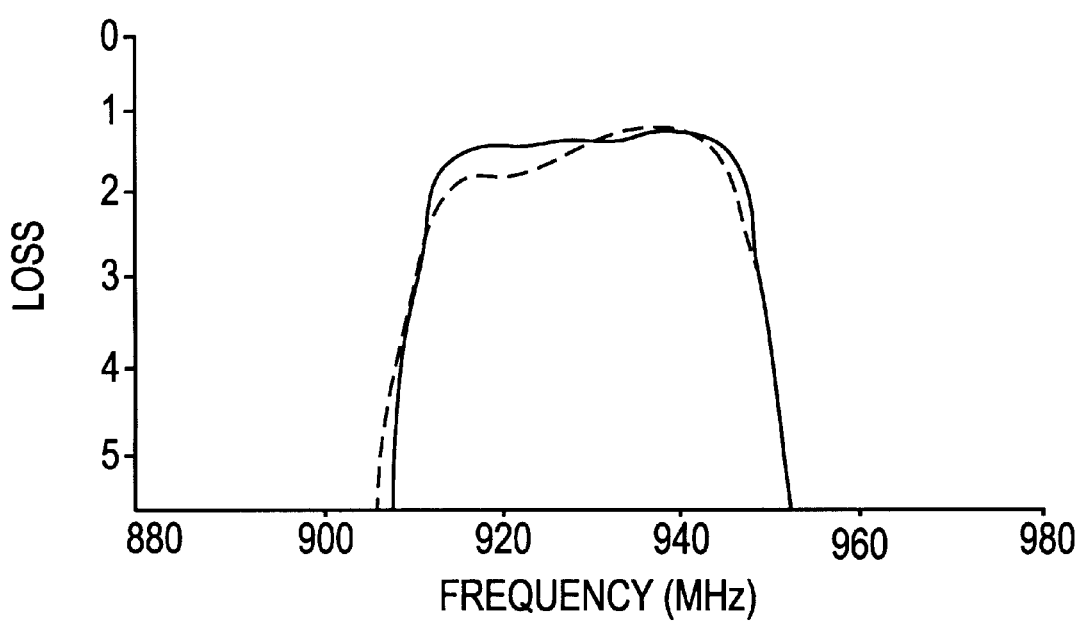

FIG. 6A illustrates the VSWR characteristics of the surface acoustic wave filters of the above preferred embodiment and the comparison example, and FIG. 6B illustrates the insertion loss-frequency characteristics thereof.

In FIGS. 6A and 6B, the solid lines represent the characteristics of the present preferred embodiment, and the broken lines indicate of the conventional example.

As seen in FIGS. 6A and 6B, the VSWR characteristics in the band of the surface acoustic wave filter 1 of the present preferred embodiment are improved as compared with characteristics of the surface acoustic wave filter of the conventional example. Particularly, VSWR is effectively reduced on the lower frequency side, and thereby, the loss on the lower frequency side is reduced by about 0.5 dB.

Thus, by making the electrode pitch of IDT of the second parallel resonator P2 longer than that of the first and third parallel resonators, the impedance relevance on the lower frequency side is greatly improved, and the reflection characteristic is also significantly improved.

Figure 7:
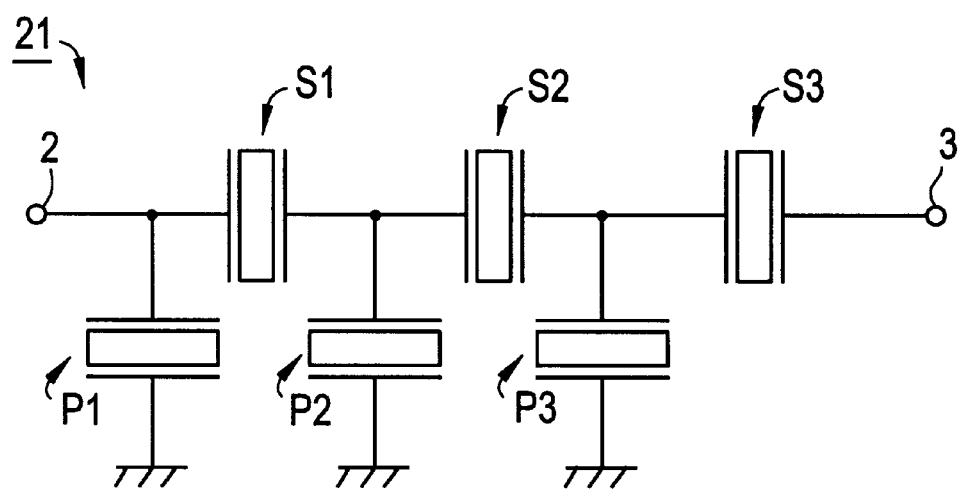
FIG. 7 is an explanatory circuit diagram of the surface acoustic wave filter according to a second preferred embodiment.

FIG. 7 is a circuit diagram of a surface acoustic wave filter according to a second preferred embodiment of the present invention. The surface acoustic wave filter 21 of this preferred embodiment is configured in a manner similar to that of the surface acoustic wave filter 1 of the first preferred embodiment except that three series resonators SI through S3 are arranged in the series arm. That is, one series resonator is added as compared with the surface acoustic wave filter 1 of the first preferred embodiment.

In the above-described surface acoustic wave 21, an LiTaO$_3$ substrate was used. One-port SAW resonators defining the series resonators S1–S3 and the parallel resonators P1–P3 were disposed on the LiTaO$_3$ substrate used as a piezoelectric substrate, in a manner similar to that of the first preferred embodiment.

Table 2 below lists the electrode finger pitches of IDT of the first, second and third parallel resonators P1–P3. In addition, the resonant frequencies of the parallel resonators P1–P3 are also listed in Table 2.

For comparison, as a conventional example, a surface acoustic wave filter was produced which was configured in a manner similar to that of the second preferred embodiment except that the electrode pitches of IDT of the parallel resonators P1–P3 were set at about 2.100 μm as listed in the following Table 2. The resonant frequencies of the parallel resonators P1–P3 in the surface acoustic wave filter of the conventional example are also listed in the following Table 2.

TABLE 2

| Resonator | Electrode finger pitch of second preferred embodiment (μm) | Electrode finger pitch of conventional example (μm) | Frequency of second preferred embodiment (MHz) | Frequency of conventional example (MHz) |
| --- | --- | --- | --- | --- |
| P1 | 2.100 | 2.100 | 948 | 948 |
| P2 | 2.110 | 2.100 | 938 | 948 |
| P3 | 2.100 | 2.100 | 948 | 948 |

Figure 8:
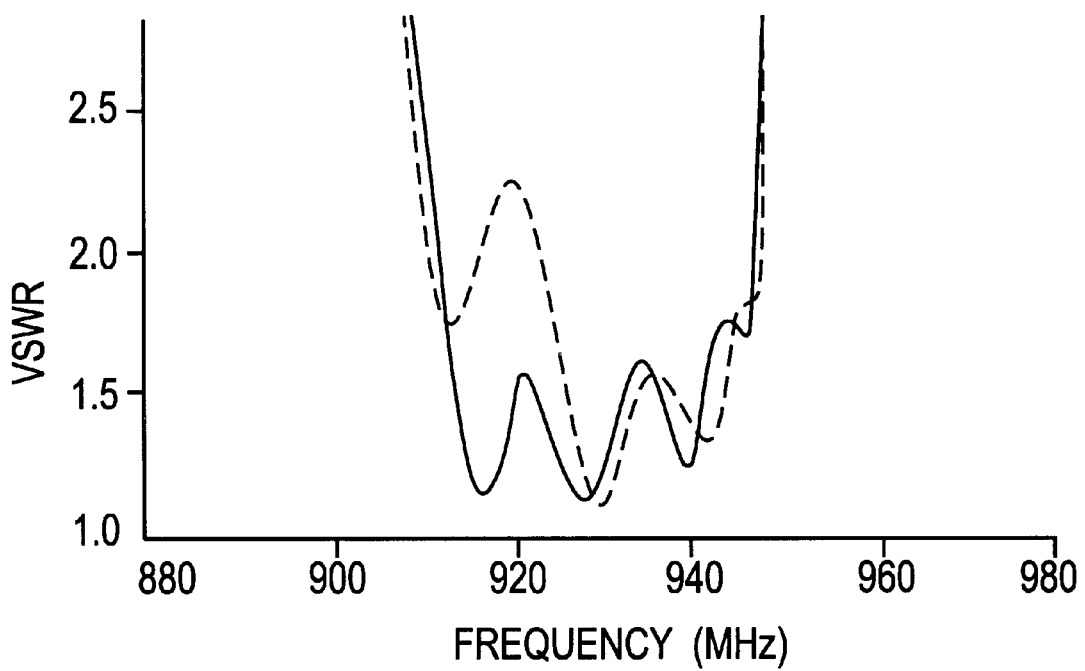
FIG. 8 is a graph showing the VSWR characteristics and the insertion loss-frequency characteristics of the surface acoustic wave filters of the second preferred embodiment and the conventional example.
Figure 9:
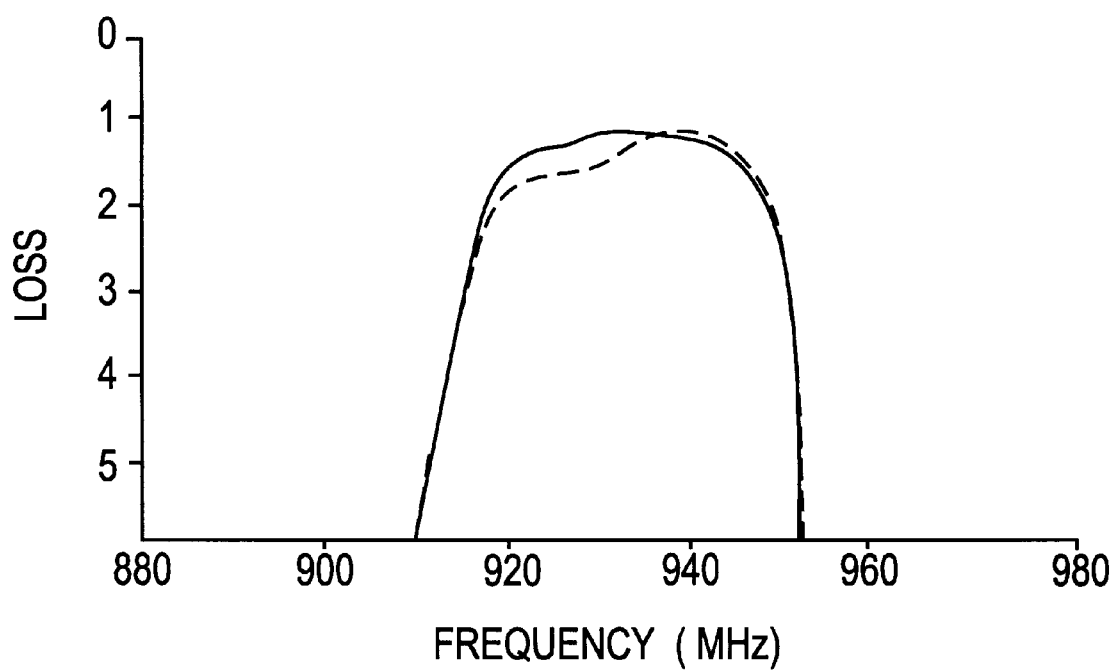
FIG. 9 is a graph showing the insertion loss-frequency characteristics of the surface acoustic wave filters of the second embodiment and the conventional example.
Figure 10:
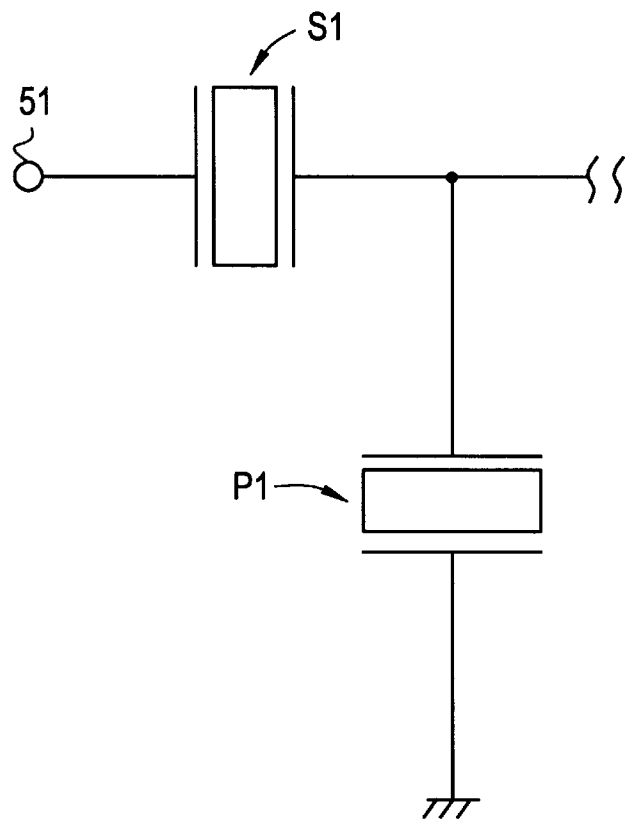
FIG. 10 is an explanatory circuit diagram of a conventional surface acoustic wave filter having a ladder type circuit configuration.
Figure 11:
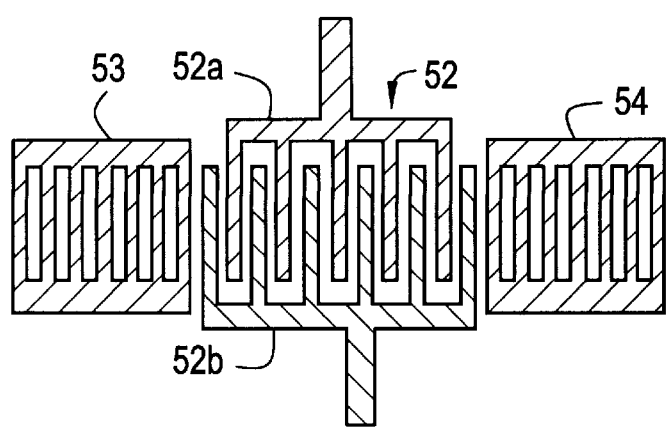
FIG. 11 is an explanatory plan view of a one-port SAW resonator.
Figure 12:
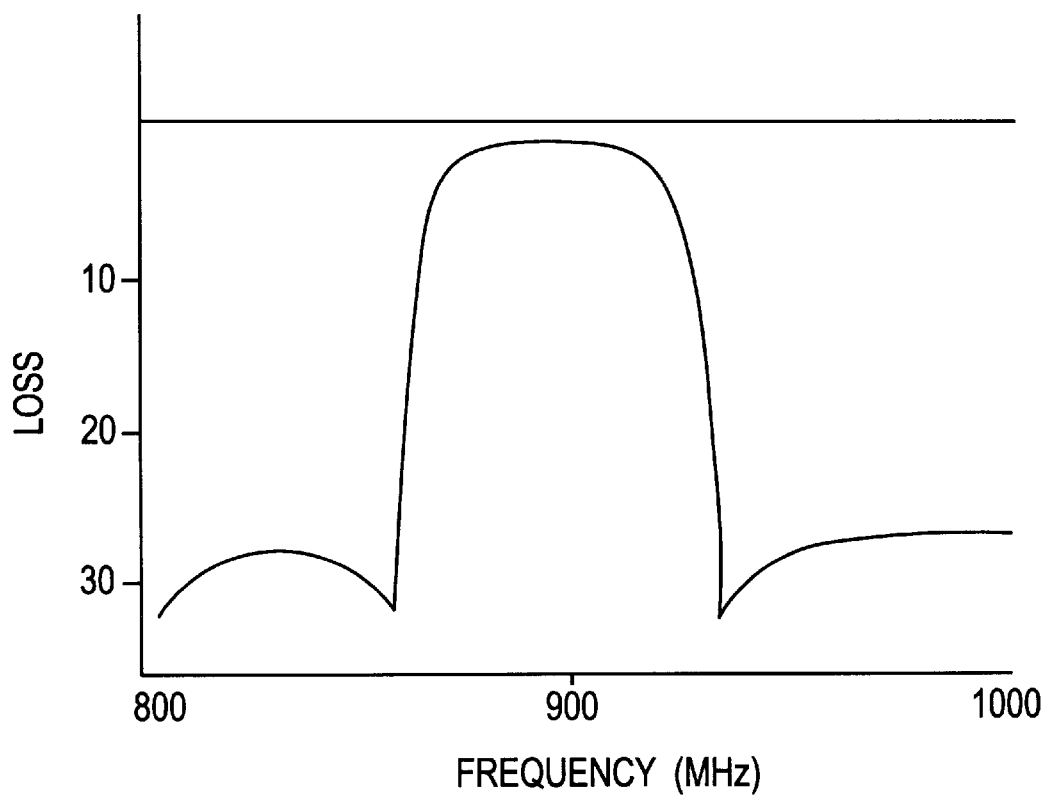
FIG. 12 is a graph showing, as one example, the attenuation frequency characteristics of the conventional surface acoustic wave filter.

FIG. 8 illustrates the VSWR characteristics of the surface acoustic wave filter 21 of the second preferred embodiment and the surface acoustic wave filter of the conventional example which were prepared in the above-described manner, and FIG. 9 illustrates the insertion loss-frequency characteristics of the filters.

In FIGS. 8 and 9, the solid lines represent the characteristic of the surface acoustic wave filter of the second preferred embodiment, and the broken lines represent the characteristics of the conventional example.

As seen in FIGS. 8 and 9, in the second preferred embodiment, the VSWR characteristics on the lower frequency side can be effectively improved. Accordingly, as apparent from FIG. 9, the loss can be reduced in a wide frequency range, particularly on the lower frequency side, in the band.

In the above-described first and second preferred embodiments, the resonant frequency of the second parallel resonator P2 is varied relative to that of the first and third parallel resonators P1 and P3 by changing the electrode pitch. However, in order to vary the resonant frequency, various methods may be used to change the electrode finger width, a thin film capable of varying the sound velocity is adhered to the interdigital electrodes constituting the IDT, and the like, in addition to the manner by changing the electrode pitch. Thus, the manner for varying the resonant frequency of the second parallel resonator P2 with respect to the first and third parallel resonators P1 and P3 has no particular limitation.

Further, in the first and second preferred embodiments, the ladder type surface acoustic wave filters each containing three parallel resonators are described. The present invention is not restricted to such ladder type surface acoustic wave filters, and is applicable to a surface acoustic wave filter containing at least four parallel resonators.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter having a ladder type circuit configuration, comprising:

an input terminal;

an output terminal;

at least one series arm;

a plurality of parallel arms;

a plurality of series resonators included in the at least one series arm located between the input and output terminals; and a plurality of parallel resonators included in the plurality of parallel arms, respectively, located between the at least one series arm and a reference potential; wherein said series resonators and parallel resonators each include a one-port surface acoustic wave resonator, the parallel resonators are arranged alternately with the series resonators along a direction extending from the input terminal toward the output terminal, and a resonant frequency of at least one of the parallel resonators is different from resonant frequencies of the others of the plurality of parallel resonators;

first, second, and third of said parallel arms are arranged along the direction extending from the input terminal toward the output terminal, in that order, and the resonant frequency of the parallel resonator included in the second parallel arm is different from the resonant frequencies of the parallel resonators included in the first and third parallel arms, such that if f1 represents the resonant frequency of the parallel resonator included in the second arm, and f2 represents the resonant frequency of at least one of the parallel resonators included in the first and third arms, the following formula (1) is satisfied:

$$f2 > f1 > 0.99 \times f2 \qquad \text{formula (1)}.$$

2. A surface acoustic wave filter according to claim 1, wherein the plurality of parallel resonators include a plurality of interdigital transducers, and electrode finger pitches of the interdigital transducers of the plurality of parallel resonators are different from each other such that the resonant frequency of said at least one parallel resonator is different from the resonant frequencies of the others of the plurality of parallel resonators.

3. A surface acoustic wave filter according to claim 1, wherein the resonant frequency of the parallel resonator included in the second parallel arm is lower than that of each of the parallel resonators included in the first and third parallel arms.

4. A surface acoustic wave filter according to claim 1, wherein the plurality of parallel resonators includes at least three parallel resonators.

5. A surface acoustic wave filter according to claim 1, wherein the plurality of parallel resonators includes at least four parallel resonators.

6. A surface acoustic wave filter according to claim 1, wherein the plurality of parallel resonators include a plurality of interdigital transducers and a thin film arranged to change the sound velocity is adhered to the interdigital electrodes.

7. A surface acoustic wave filter having a ladder type circuit configuration, comprising:

an input terminal;

an output terminal;

at least one series arm;

a plurality of parallel arms;

a plurality of series resonators included in the at least one series arm located between the input and output terminals; and a plurality of parallel resonators included in the plurality of parallel arms, respectively, located between the at least one series arm and a reference potential; wherein said series resonators and parallel resonators each include a one-port surface acoustic wave resonator, the parallel resonators are arranged alternately with the series resonators along a direction extending from the input terminal toward the output terminal, and a resonant frequency of at least one of the parallel resonators is different from resonant frequencies of the others of the plurality of parallel resonators;

first, second, and third of said parallel arms are arranged along the direction extending from the input terminal toward the output terminal, in that order, and the resonant frequency of the parallel resonator included in the second parallel arm is different from the resonant frequencies of the parallel resonators included in the first and third parallel arms;

the electrode finger pitch of the parallel resonator included in the second parallel arm is different from the electrode finger pitches of the parallel resonators included in at least one of the first and third parallel arms such that the resonant frequency of the parallel resonator included in the second parallel arm is different from the resonant frequencies of the parallel resonators included in the at least one of the first and third parallel arms, such that if L1 represents the electrode finger pitch of the parallel resonator included in the second parallel arm, and L2 represents the electrode finger pitch of the parallel resonators included in at least one of the first and third parallel arms, the following formula (2) is satisfied:

$$L2 < L1 < 1.01 \times L2 \qquad \text{formula (2)}.$$

8. A surface acoustic wave filter comprising:

an input terminal;

an output terminal;

at least one series arm;

at least two parallel arms;

a plurality of series resonators included in the at least one series arm located between the input and output terminals; and a plurality of parallel resonators included in the at least two parallel arms, respectively, located between the at least one series arm and a reference potential; wherein said series resonators and parallel resonators each include a one-port surface acoustic wave resonator, the parallel resonators are arranged alternately with the series resonators along a direction extending from the input terminal toward the output terminal, and a resonant frequency of the at least two parallel resonators are different;

first, second, and third of said parallel arms are arranged along the direction extending from the input terminal toward the output terminal, in that order, and the resonant frequency of the parallel resonator included in the second parallel arm is different from the resonant frequencies of the parallel resonators included in the first and third parallel arms, such that if f1 represents the resonant frequency of the parallel resonator included in the second arm, and f2 represents the resonant frequency of at least one of the parallel resonators included in the first and third arms, the following formula (1) is satisfied:

$$f2>f1>0.99\times f2 \qquad \text{formula (1).}$$

9. A surface acoustic wave filter according to claim 8, wherein the at least two parallel resonators include a plurality of interdigital transducers, and electrode finger pitches of the interdigital transducers of the at least two parallel resonators are different from each other such that the resonant frequency of one of the at least two parallel resonators is different from the resonant frequency of the other of the at least two parallel resonators.

10. A surface acoustic wave filter according to claim 8, wherein the resonant frequency of the parallel resonator included in the second parallel arm is lower than that of each of the parallel resonators included in the first and third parallel arms.

11. A surface acoustic wave filter according to claim 8, wherein the plurality of parallel resonators includes at least three parallel resonators.

12. A surface acoustic wave filter according to claim 8, wherein the plurality of parallel resonators includes at least four parallel resonators.

13. A surface acoustic wave filter according to claim 8, wherein the plurality of parallel resonators include a plurality of interdigital transducers and a thin film arranged to change the sound velocity is adhered to the interdigital electrodes.

14. A surface acoustic wave filter comprising:

an input terminal;

an output terminal;

at least one series arm;

at least two parallel arms;

a plurality of series resonators included in the at least one series arm located between the input and output terminals; and a plurality of parallel resonators included in the at least two parallel arms, respectively, located between the at least one series arm and a reference potential; wherein said series resonators and parallel resonators each include a one-port surface acoustic wave resonator, the parallel resonators are arranged alternately with the series resonators along a direction extending from the input terminal toward the output terminal, and a resonant frequency of the at least two parallel resonators are different;

first, second, and third of said parallel arms are arranged along the direction extending from the input terminal toward the output terminal, in that order, and the resonant frequency of the parallel resonator included in the second parallel arm is different from the resonant frequencies of the parallel resonators included in the first and third parallel arms;

the electrode finger pitch of the parallel resonator included in the second parallel arm is different from the electrode finger pitches of the parallel resonators included in at least one of the first and third parallel arms such that the resonant frequency of the parallel resonator included in the second parallel arm is different from the resonant frequencies of the parallel resonators included in the at least one of the first and third parallel arms, such that if L1 represents the electrode finger pitch of the parallel resonator included in the second parallel arm, and L2 represents the electrode finger pitch of the parallel resonators included in at least one of the first and third parallel arms, the following formula (2) is satisfied:

$$L2<L1<1.01\times L2 \qquad \text{formula (2).}$$

* * * * *